(12) United States Patent
Song

(10) Patent No.: US 6,316,837 B1
(45) Date of Patent: Nov. 13, 2001

(54) AREA ARRAY TYPE SEMICONDUCTOR PACKAGE AND FABRICATION METHOD

(75) Inventor: Chi-Jung Song, Daejon (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/200,937

(22) Filed: Nov. 30, 1998

(30) Foreign Application Priority Data

Dec. 4, 1997 (KR) .................................................. 97-65912

(51) Int. Cl.[7] .................................................. H01L 23/48
(52) U.S. Cl. ............................ 257/778; 257/666; 257/676
(58) Field of Search .................................. 257/666, 676, 257/778, 737, 738

(56) References Cited

U.S. PATENT DOCUMENTS

| | | | |
|---|---|---|---|
| 5,241,133 | 8/1993 | Mullen, III et al. | 174/52.4 |
| 5,355,283 | 10/1994 | Marrs et al. | 361/760 |
| 5,834,831 | * 11/1998 | Kuboto et al. | 257/676 |
| 5,965,936 | * 10/1999 | Stave | 257/666 |

* cited by examiner

*Primary Examiner*—Roy Potter
(74) *Attorney, Agent, or Firm*—Fleshner & Kim, LLP

(57) ABSTRACT

An area array type semiconductor package includes a plurality of conductive media, such as solder bumps or solder balls, attached to respective bond pads of a chip. The conductive media act as external output terminals. The chip is attached to a lead frame by a thermal conductive adhesive, and a predetermined area of the lead frame and the semiconductor chip are packaged with a molding resin. Leads of the lead frame are then trimmed and formed so that the lead frame, to which the semiconductor chip is adhered, acts as a heat sink. This allows the package to be used for a high-powered semiconductor device which radiates a high temperature heat. Also, because conductive media such as solder bumps or solder balls can be used to directly connect bond pads of the chip to conductive regions of a circuit board, a size of the semiconductor package can be minimized, the arrangement of the bonding pads on the chip can be easily planned, and electrical characteristics of the semiconductor package can be improved.

21 Claims, 4 Drawing Sheets

AREA ARRAY TYPE SEMICONDUCTOR PACKAGE AND FABRICATION METHOD

BACKGROUND OF THE INVENTION

1. Field of the Invention

The present invention relates to a chip package, and more particularly, to a chip package having a lead frame serving as a heat sink. The invention also relates to a method of forming the chip package.

2. Background of the Related Art

A ball grid array (BGA) semiconductor package is widely used since the package is capable of having a large number of pins in a predetermined area. Also, the external terminals of the device are short, which helps to prevent them from being bent. Such a semiconductor package may be quickly mounted on a mother board through a reflow process, thereby reducing a manufacturing time.

As shown in FIG. 1, a background art BGA semiconductor package includes a printed circuit board (PCB) 1 having a plurality of metal patterns (not illustrated) formed therethrough. A semiconductor chip 2 having a plurality of bonding pads (not illustrated) is adhered on the PCB 1 by an adhesive 1a. Metal wires 3 electrically connect each bonding pad with a corresponding metal pattern in the PCB, and a molding epoxy 4 molds a predetermined area on the PCB 1 including the semiconductor chip 2 and the metal wire 3. A plurality of solder balls 5, which serve as external terminals, are adhered on the lower surface of the PCB 1. The metal patterns provide an electric path through the PCB to electrically connect the wires 3 on the upper side to the solder balls 5 on the lower side of the PCB 1.

FIG. 2 is a flow chart illustrating steps of a fabrication method for a background art BGA semiconductor package. As shown therein, the process includes: a sawing process for dividing a plurality of semiconductor devices which are formed in a wafer into individual semiconductor chips. Next, a die bonding process is performed to attach individual semiconductor chips on a PCB. A wire bonding process is performed for connecting a plurality of bonding pads of each semiconductor chip to a plurality of metal patterns of the PCB with a plurality of wires. Next, a molding process is performed to mold a predetermined area formed on the PCB, including the semiconductor chip and the wires with a molding epoxy. Finally, a ball bonding process is performed to bond solder balls on a lower surface of the PCB to serve as external output terminals.

Since the solder balls of the above-described BGA semiconductor package are located opposite to an active surface of the semiconductor chip (i.e., the upper surface of the semiconductor chip having bond pads), there is a limitation on the minimum size of the semiconductor package due to the height necessary to allow the wires to bend from the top of the chip down to the PCB.

Also, heat generated in the semiconductor chip is not effectively radiated outside the package. Accordingly, such a package is not suitable for a high-powered semiconductor device.

SUMMARY OF THE INVENTION

It is an object of the present invention to solve the problems and disadvantages of the related art.

It is another object of the present invention to more efficiently radiate heat.

It is a further object of the invention to enable a lead frame to serve as a heat sink.

A further object of the present invention is to provide a packaging for a high-powered semiconductor device which radiates high temperature heat.

To achieve the above objects, a fabrication method for an area array type semiconductor package embodying the invention, includes the steps of forming solder bumps on bonding pads of a semiconductor chip, bonding said semiconductor chip to a lead frame; packaging a predetermined area of the lead frame and the semiconductor chip with a molding resin; and trimming and forming said lead frame.

The lead frame may include a plurality of die paddles which are attached to a corresponding plurality of semiconductor chips by a thermal conductive adhesive. A plurality of leads are attached to each of the die paddles at a certain interval and serve to radiate heat to an exterior of the package.

In a chip package embodying the invention, a chip is attached to a lead frame having a plurality of leads. A plurality of conductive media are formed on bond pads of the chip. A molding resin packages portions of the chip and the lead frame.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

Figure 1:
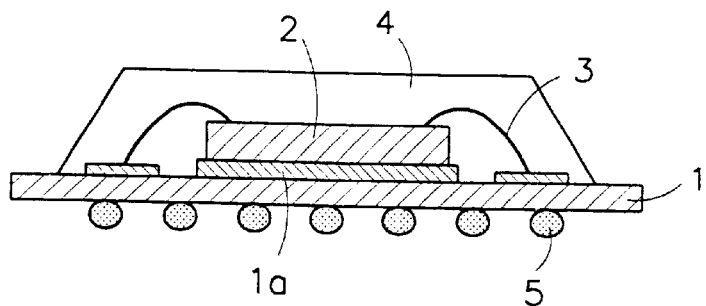
FIG. 1 is a vertical cross-sectional view illustrating a background art ball grid array semiconductor package.
Figure 2:
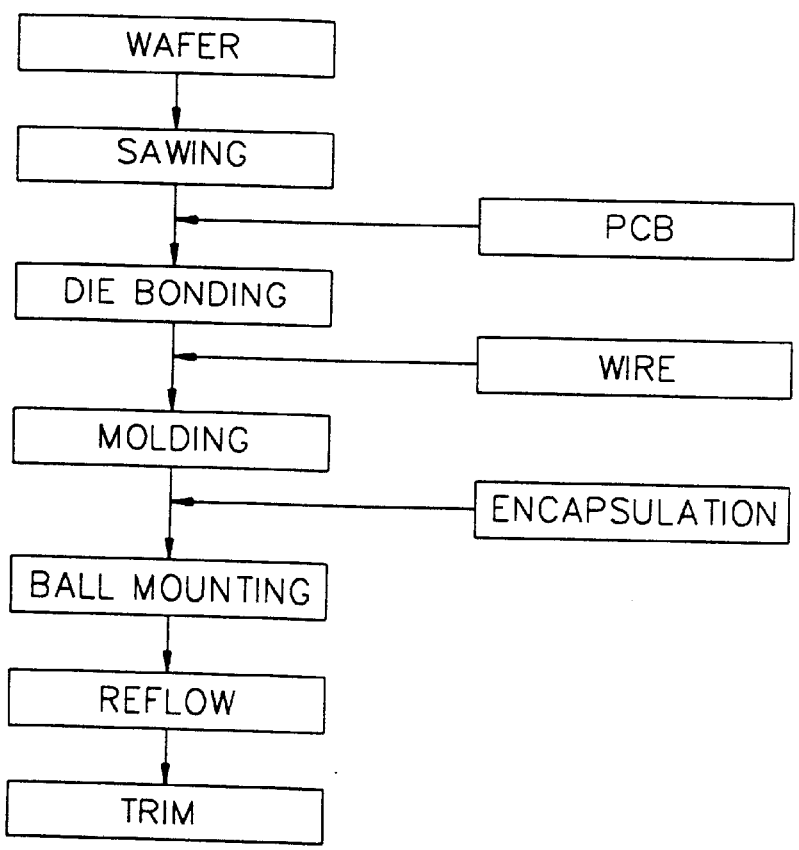
FIG. 2 is a flow chart illustrating a background art fabrication method for the ball grid array semiconductor package shown in FIG. 1.
Figure 3:
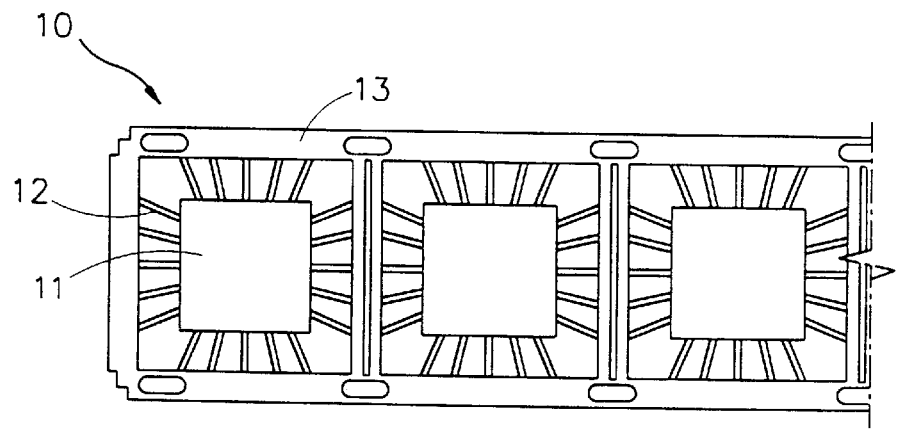
FIG. 3 is a plan view illustrating a lead frame of an area array type semiconductor package according to the present invention.

FIG. 3 is a plan view illustrating a lead frame of an area array type semiconductor package according to the present invention. As shown therein, the lead frame 10 includes a plurality of square shaped die paddles 11, to which semiconductor chips are adhered. A plurality of leads 12 are attached to and extend away from each die paddle 11 at a certain interval. A lead supporting member 13 supports the plurality of leads 12. As can be appreciated, the lead frame 10 may be made of copper, a copper alloy, a tungsten alloy or any other suitable material. Each of the die paddles 11 may also have a hole, depression or dimple for receiving a chip.

Figure 4:
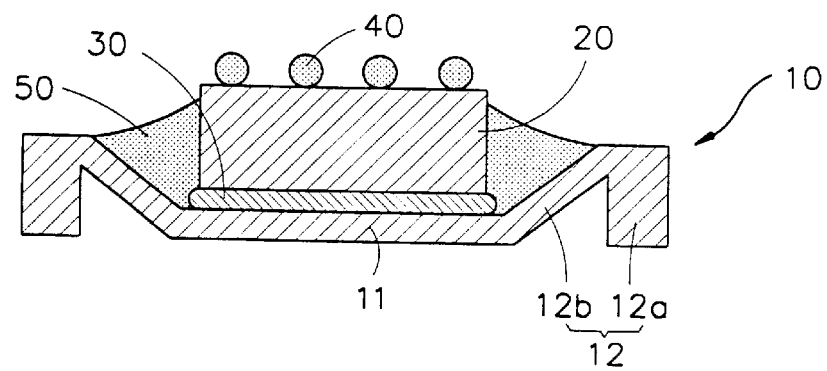
FIG. 4 is a vertical cross-sectional view of an area array type semiconductor package according to the present invention.

FIG. 4 is a cross-sectional view of an area array type semiconductor package according to the present invention which utilizes the lead frame shown in FIG. 3. As shown therein, the package includes a semiconductor chip 20, having a plurality of bonding pads (not illustrated) thereon. The chip 20 is attached to the paddle 11 via a thermal conductive adhesive 30. A plurality of conductive media such as solder bumps or solder balls 40, which serve as external output terminals, are formed on respective bonding pads of the semiconductor chip 20. A molding resin 50 covers portions of the semiconductor chip 20 and lead frame 11. In the above-described semiconductor package, the lead frame 10 operates as a heat sink which radiates heat generated by the semiconductor chip 20. Preferably, a thermal conductive epoxy is used as the adhesive 30.

Figure 5A:
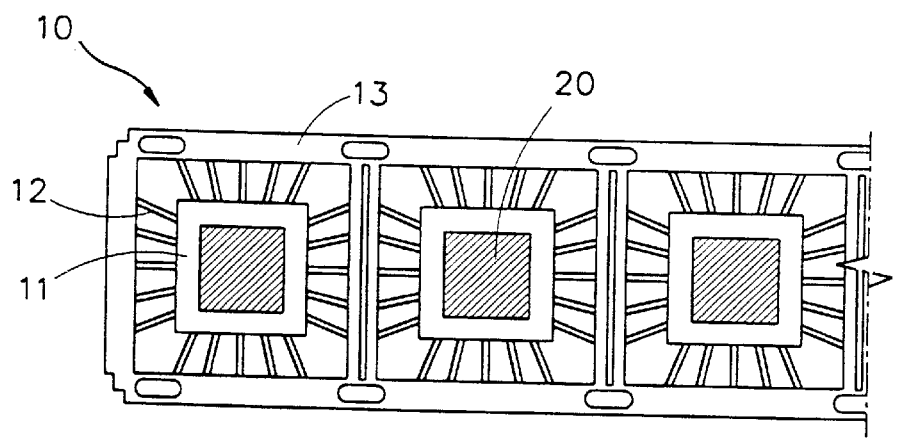
FIGS. 5A to 5E are plan and cross-sectional views illustrating the results of steps of a fabrication method for the area array type semiconductor package according to the present invention.
Figure 5B:
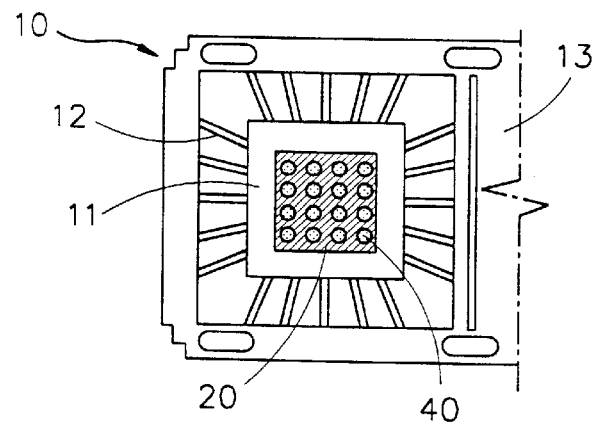

FIGS. 5A to 5E show the results of steps of a fabrication method for an area array type semiconductor package according to the present invention. As shown in FIGS. 5A and 5B, a semiconductor chip 20 is first adhered to a die paddle 11 of the lead frame 10 using an adhesive 30. A plurality of conductive media 40 are then formed on bond pads of the semiconductor chip 20. Of course, the conductive media 40 could be formed on the chip 20 before the chip 20 is bonded to the die paddle 11.

Figure 5C:
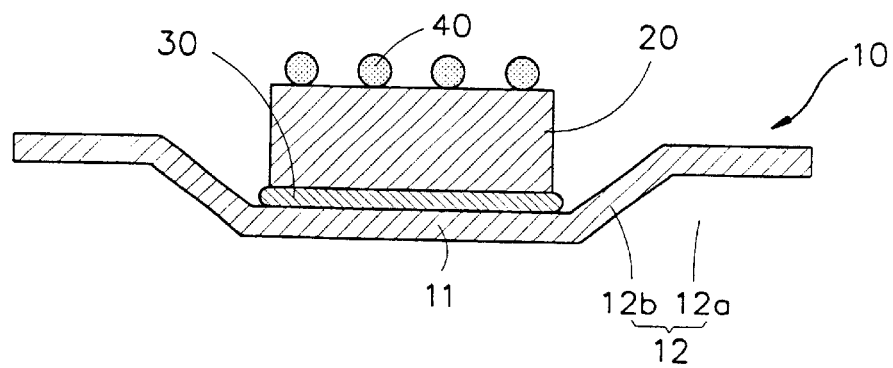
Figure 5D:
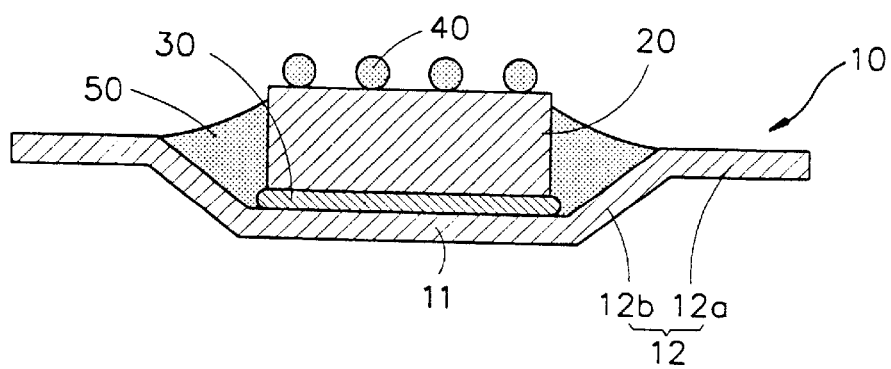
Figure 5E:
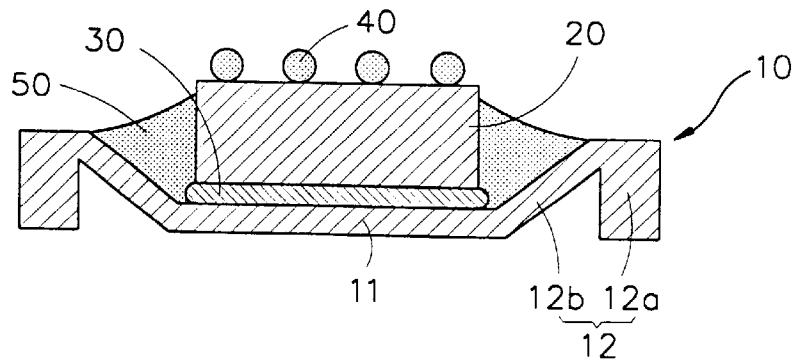

Next, as shown in FIGS. 5C and 5D, a predetermined area formed on the lead frame 10, including the semiconductor chip 20, is packaged with a molding epoxy 50. The conductive media 40 formed on the bonding pads of the above semiconductor chip 20 are externally exposed. Each lead 12 of the lead frame is divided into two parts, an outer lead 12a which is externally exposed and an inner lead 12b which is at least partially packaged by the molding epoxy 50. As shown in FIG. 5E, the exposed outer lead 12a is then trimmed and formed, thus completing an area array type semiconductor package according to the present invention.

Figure 6:
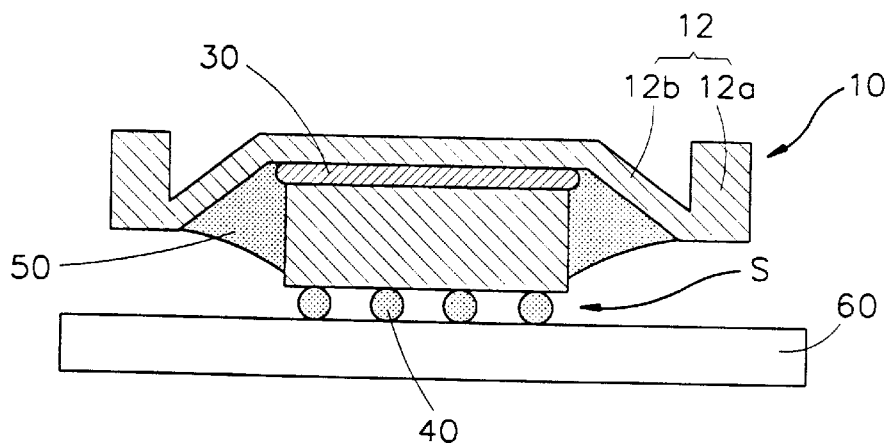
FIG. 6 is a cross-sectional view illustrating an area array type semiconductor package according to the present invention mounted on a printed circuit board.

FIG. 6 illustrates how an area array type semiconductor package according to the present invention is mounted on a printed circuit board (PCB) 60 using the conductive media 40, preferably, solder balls. A reflow process can be used to attach the conductive media 40 to conductive pads on the PCB 60.

Figure 7:
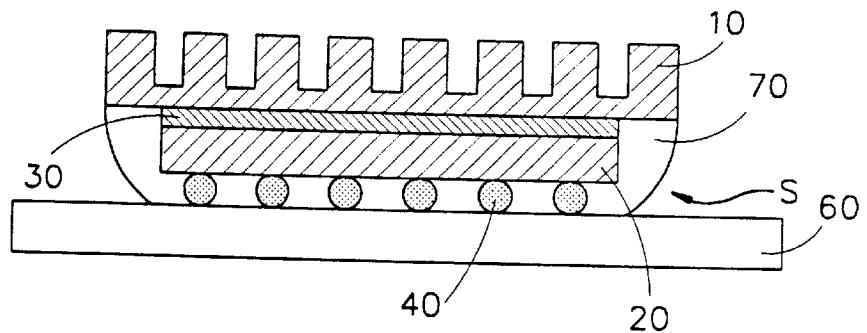
FIG. 7 is a cross-sectional view illustrating an alternate embodiment of an area array type semiconductor package according to the present invention mounted on the printed circuit board.

In an alternate embodiment, as shown in FIG. 7, the space S between the chip 20 and the PCB 60 may be filled with a molding compound 70, or any other suitable material, as is well known to those skilled in the art. Also, in the embodiment shown in FIG. 7, a plurality of cooling fins 10 extend away from the top surface of the lead frame 10.

As described above, an area array type semiconductor package according to the present invention uses a lead frame, to which the semiconductor chip is bonded, as a heat sink. This allows the package to be used for a high-powered semiconductor device which radiates heat at a high temperature.

Also, unlike the background art semiconductor package which communicates with bond pads of a chip through metal wires and conductive regions passing through a PCB, the area array type semiconductor package according to the present invention includes conductive media such as solder bumps or solder balls directly attached to the bond pads of a chip. The conductive media act as external output terminals. This configuration allows the dimensions of the semiconductor package to be minimized. Also, the bonding pad arrangement can easily be planned, and electrical characteristics of the semiconductor package can be improved. In addition, because the space between the semiconductor chip and the PCB can be underfilled with a molding compound or resin, a reliability of the solder joint can be improved.

The foregoing embodiments are merely exemplary and are not to be construed as limiting the present invention. The present teaching can be readily applied to other types of apparatus. Many alternatives, modifications, and variations will be apparent to those skilled in the art. In the claims, means-plus-function clauses are intended to cover the structures described herein as performing the recited function and not only structural equivalents but also equivalent structures. For example, although a wire and a solder ball may not be structural equivalents in that a wire can be routed in various ways over a substantial distance to electrically connect two elements, whereas a solder bump must be sandwiched between the elements being connected, in the environment of making electrical connections, a wire and a solder bump may be equivalent structures.

What is claimed is:

1. A chip package, comprising:
   a lead frame including a plurality of leads and a die paddle;
   an integrated chip having a plurality of bonding pads, wherein the chip is attached to the die paddle of the lead frame, and wherein the die paddle and adjoining portions of the leads are substantially co-planar;
   a plurality of conductive media formed on the bonding pads of the chip; and
   a molding resin that packages a predetermined area on the lead frame and the chip.

2. The package of claim 1, wherein certain portions of the leads of the lead frame are bent in an upward or downward direction.

3. The package of claim 1, wherein the chip is attached to a die paddle of the lead frame, and wherein an area of the die paddle is larger than an attachment surface area of the chip.

4. The package of claim 3, wherein a portion of said die paddle is bent or recessed.

5. The package of claim 1, wherein the chip is attached to a die paddle of the lead frame, and wherein an area of the die paddle is approximately the same size as an attachment area of the chip.

6. The package of claim 1, wherein a thermal-conducting adhesive attaches the chip to the lead frame.

7. The package of claim 1, wherein portions of the plurality of conductive media are exposed outside the resin.

8. The package of claim 1, wherein the bonding pads are formed on a first side of the chip, and the lead frame is attached to a second side of the chip.

9. A chip package, comprising:
   a lead frame comprising a plurality of leads and a die paddle;
   an integrated chip comprising a plurality of bonding pads, wherein the chip is attached to the die paddle of the lead frame, and wherein an area of the die paddle is approximately the same size as an attachment area of the chip;
   a plurality of conductive media formed on the bonding pads of the chip; and
   a molding resin that packages a predetermined area on the lead frame and the chip wherein a portion of the die paddle is exposed outside of the molding resin.

10. A chip package, comprising:

a lead frame comprising a plurality of leads and a die paddle;

an integrated chip comprising a plurality of bonding pads, wherein the chip is attached to the die paddle of the lead frame, and wherein a portion of said die paddle is bent or recessed;

a plurality of conductive media formed on the bonding pads of the chip; and a molding resin that packages a predetermined area on the lead frame and the chip.

11. A chip package, comprising:

a lead frame having a plurality of leads and a die paddle;

an integrated chip having a plurality of bonding pads formed on a first surface of the chip, wherein a second surface of the chip is attached to the die paddle of the lead frame, the first and second surfaces being opposing surfaces;

a plurality of solder bumps or balls formed on the bonding pads of the first surface of the chip; and a molding resin that packages a predetermined area on the lead frame and the chip.

12. The package of claim 11, wherein a portion of said die paddle is bent or recessed.

13. The package of claim 11, wherein an area of the die paddle is approximately the same size as an attachment area of the chip.

14. The package of claim 11, wherein the die paddle and adjoining portions of the leads are substantially co-planar.

15. The package of claim 11, wherein the die paddle has a hole, depression or dimple for receiving the chip.

16. The package of claim 11, wherein the lead frame further comprises a lead supporting member for supporting the plurality of leads.

17. The package of claim 11, wherein the lead frame comprises copper, a copper alloy or a tungsten alloy.

18. The package of claim 11, wherein the solder bumps or balls are substantially spherical.

19. The package of claim 11, wherein the solder bumps or balls are exposed outside the resin.

20. The package of claim 11, wherein an area of the die paddle is larger than an attachment surface area of the chip.

21. The package of claim 11, wherein the first surface of the integrated chip is exposed.

* * * * *